Figure 1:
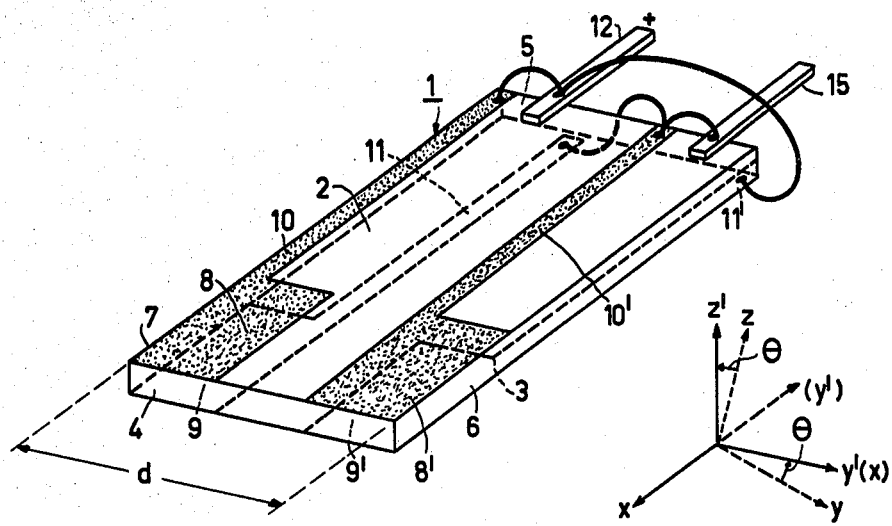

United States Patent [19]

Vangheluwe

[11] 4,388,548
[45] Jun. 14, 1983

[54] MULTIPLE MODE PIEZOELECTRIC RESONATOR

[75] Inventor: Daniel C. L. Vangheluwe, Eindhoven, Netherlands

[73] Assignee: U.S. Philips Corporation, New York, N.Y.

[21] Appl. No.: 225,958

[22] Filed: Jan. 19, 1981

[30] Foreign Application Priority Data

Jan. 17, 1980 [NL] Netherlands .......................... 8000297

[51] Int. Cl.³ .......................................... H01L 41/08
[52] U.S. Cl. .................................... 310/365; 310/366; 310/361
[58] Field of Search ............... 310/370, 320, 365, 366, 310/368, 360, 361

[56] References Cited

U.S. PATENT DOCUMENTS

| | | | |
|---|---|---|---|
| 2,886,787 | 5/1959 | Broadhead, Jr. et al. | 310/320 X |
| 3,944,862 | 3/1976 | Shimoi et al. | 310/370 X |
| 3,946,257 | 3/1976 | Kawamura | 310/370 |
| 4,099,078 | 7/1978 | Shibata et al. | 310/370 X |
| 4,178,527 | 12/1979 | Kawashima | 310/370 |

FOREIGN PATENT DOCUMENTS

| | | | |
|---|---|---|---|
| 54-100685 | 8/1979 | Japan | 310/370 |
| 1425435 | 3/1974 | United Kingdom | 310/370 |
| 2006520 | 6/1978 | United Kingdom | 310/370 |

*Primary Examiner*—Mark O. Budd
*Attorney, Agent, or Firm*—Robert T. Mayer; Bernard Franzblau

[57] ABSTRACT

A piezoelectric resonator having a rectangular resonator body cut from a piezoelectric crystal in accordance with a rotated X-cut. One of the end faces bounding the major surfaces is intended for mounting, whereas in the vicinity of the other end face an electrode array is arranged. The electrode array in conjunction with the crystal cut have been selected so that a combined resonant mode is generated, comprising an XY' thickness-shear vibration and a thickness vibration in the X or Y' direction.

8 Claims, 4 Drawing Figures

MULTIPLE MODE PIEZOELECTRIC RESONATOR

This invention relates to a piezoelectric resonator comprising a body in the form of a substantially rectangular block cut from a piezoelectric crystal, which body comprises two major surfaces which are parallel to each other and which in the direct vicinity of one of the two end faces bounding said major surfaces are provided with an electrode array, the end face disposed opposite said one end face being intended for supporting the body and the body exhibiting a crystal cut rotated about the X-axis.

In this respect a crystal cut rotated about the X-axis is to be understood to mean, as is customary, that the body has been cut from the crystal with such an orientation that one principal axis of the body is parallel to the X-axis, whereas the two other principal axes are parallel to a Y' and Z' axis respectively, which are obtained by rotation of the Y and Z crystal axes about the X-axis.

Such a resonator is, for example, known from U.S. Pat. No. 4,017,797. In this resonator the body comprises an elongate, rectangular block cut from a quartz crystal in accordance with the AT cut, the body comprising two elongate major surfaces having the longitudinal axis in the Z' direction and the transverse axis in the X-direction. The major surfaces are provided with electrodes disposed opposite each other. As a result of the selected cut in conjunction with the electrode array, a combined resonant mode is excited comprising an XY' thickness shear vibration and an XY' flexural vibration.

A requirement imposed on such resonators, which are intended for resonant frequencies higher than 100 kHz, is that the dimensions should be minimized. The known resonator meets this requirement in that the excited resonant modes both have a direction of motion situated in the XY' plane, i.e. a plane normal to the longitudinal axis of the body. This also means that it is possible to arrange the electrodes asymmetrically on the major surfaces, if only one of the end faces bounding these two major surfaces in the longitudinal direction is employed a supporting surface for the resonator. Since the resonant modes have a direction of motion parallel to said end faces the free end face will not disturb said resonant modes. Therefore, this end face need not meet the requirement that the vibration should have decayed at said location, which means that the electrodes may be arranged on the major surfaces in the vicinity of said free end face. Moreover, the electrodes provide so-called energy trapping, i.e. the vibrations produced are mainly confined to the interelectrode area, while the amplitude of the vibrations of the specified resonant modes outside said electrode area decreases comparatively strongly as a function of the distance from said electrode area.

The reduction of the dimensions of this known resonator is limited by the requirement that at the location of the end face which functions as the supporting surface the vibration should be damped out completely, which dictates the minimum distance between the electrode area and said supporting surface. Moreover, that resonator has the drawback that both the thickness and the width dimensions of the body determine the resonant frequency, which obviously imposes requirements in respect of manufacturing accuracy.

It is an object of the invention to provide a piezoelectric resonator which can have very small dimensions and which moreover can be manufactured in a simple and reliable manner.

According to the invention the piezoelectric resonator is characterized in that the body cut is such that the major surfaces are perpendicular to the Z'-axis and the said end faces are perpendicular to the X or Y'-axis, and that the electrode array is selected so that in the body a combined resonant mode is obtained comprising an XY' thickness-shear vibration and a thickness vibration in the X or Y' direction.

Thus, the piezoelectric resonator in accordance with the invention employs a combined resonant mode comprising an XY' thickness shear vibration and a thickness vibration in the X or Y' direction, which combined resonant mode is a so-termed edge mode. This means that this mode can be excited only in the direct vicinity of one of the end faces bounding the major surfaces, so that automatically the requirement is met that the electrodes should be arranged asymmetrically on the major surfaces, which is of importance to achieve minimal dimensions. Moreover, it is found that the adopted resonant mode is damped out very strongly at an increasing distance from said end face, which means that the distance from the end face which functions as the supporting surface to said free end face can be substantially smaller than in the known resonator. Furthermore, as a result of the resonant mode which is used, only one dimension of the body determines the resonant frequency, which greatly facilitates manufacture. In order to preclude undesired resonances in the Z'-direction, the dimension of the body in the Z'-direction is so small that in this direction no resonant modes with a frequency equal to or smaller than the frequency of the desired mode can occur.

A first embodiment of the resonator in accordance with the invention is characterized in that each of the major surfaces comprises two electrodes which are each individually situated in the direct vicinity of one of the side faces which extend transversely of the end faces.

In this embodiment the electrodes may be connected to two signal terminals in such a way that two mutually opposed electric fields which are perpendicular to the major surfaces are produced. Alternatively, the electrodes may be connected to two signal terminals in such a way that an electric field is produced which is substantially parallel to the major surfaces and the end faces.

A second embodiment of the piezoelectric resonator in accordance with the invention is characterized in that one of the major surfaces is provided with two electrodes which are individually arranged in the direct vicinity of one of the side faces which are normal to the end faces, which two electrodes are individually connected to two signal terminals, and that the other major surface is provided with a common electrode which is arranged opposite said two electrodes.

Finally, a third particularly effective embodiment of the piezoelectric resonator in accordance with the invention is characterized in that the major surfaces are provided with a first and a second pair of electrodes which are arranged opposite each other, which pairs are situated in the direct vicinity of one of the side faces which extend transversely of the end faces, and a third pair of electrodes which are arranged opposite each other and are situated between the electrodes of the first and the second pair. The electrodes of the first and the second pair are connected to a first signal terminal and the electrodes of the third pair to a second signal terminal, the body cut being selected so that the end faces are perpendicular to the X-axis.

Figure 2:
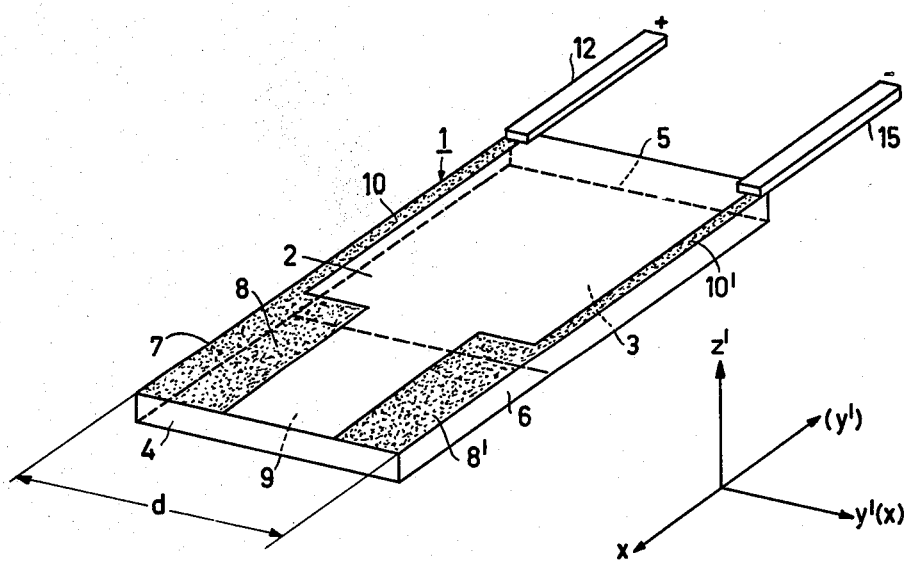
Figure 3:
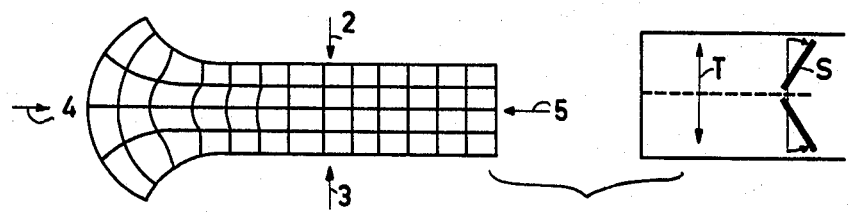
Figure 4:
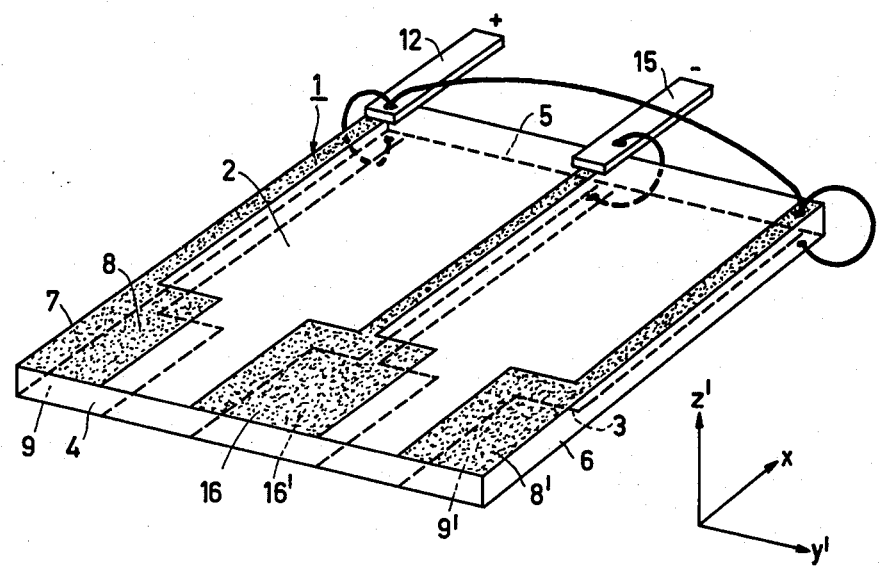

The invention will be described in more detail hereinafter with reference to the accompanying drawing in which:

FIGS. 1, 2 and 4 show a number of embodiments of the resonator in accordance with the invention and FIG. 3 schematically represents a resonance pattern.

The first embodiment of the resonator in accordance with the invention as shown in FIG. 1 comprises a body 1 in the form of a rectangular block. This block comprises two major surfaces 2 and 3, two end faces 4 and 5 and two side faces 6 and 7. This body 1 has been cut out from a piezoelectric crystal in accordance with a cut which is rotated about the X axis in such a way that the Z' axis is normal to the two major surfaces 2 and 3 and the X-axis is normal to the two end faces 4 and 5. Alternatively, it is also possible to select the Y' axis normal to the end faces 4 and 5, as is indicated in brackets in the system of axes.

On the major surface 2 two electrodes 8 and 8' are arranged, the electrode 8 adjoining the end face 4 and the side face 7, and the electrode 8' adjoining the end face 4 and the side face 6. In a similar way electrodes 9 and 9' are arranged on the major surface 3. These electrodes 8, 8', 9 and 9' are connected to the signal terminals 12 and 15 via the respective conductors 10, 10', 11 and 11' and the connecting leads connected thereto, in such a way that a cross-wise connection is obtained, i.e. that the electrodes 8 and 9' are connected to signal terminal 12 and the electrodes 8' and 9 to the signal terminal 15. By means of this electrode array two mutually opposed electric fields in the Z' direction are generated between the electrodes 8 and 9 and 8' and 9' respectively.

Alternatively the two electrodes 8 and 9 may be connected to the signal terminal 12 and the two electrodes 8' and 9' to the signal terminal 15. In that case an electric field is produced which extends substantially parallel to the major surfaces 2 and 3 and the end face 4.

If a differential input signal is applied to the two signal terminals 12 and 15, the electric field produced in the body by said signal causes a combined resonant mode, comprising an XY' thickness shear vibration and a Y' thickness vibration. The total combined vibration thus produced then has a resonance pattern as is schematically represented in FIG. 3. FIG. 3 also schematically represents the two components of this resonant pattern, namely a thickness vibration T and a thickness-shear vibration S.

This combined vibration is characterized by the fact that it remains greatly concentrated within the area near the free end face 4 and damps out very strongly outside said area at an increasing distance. As a result of this the distance between the electrodes 8 and 9, on the major surfaces, and the end face 5, which functions as the supporting surface, can be selected very small without the edge conditions imposed by said end face disturbing the resonance pattern. As an example, it has been found that in comparison with the known resonator described in the introduction, said distance between the electrodes 8 and 9 and the end face 5 can be reduced by a factor of 2 to 3. This means that the resonator in accordance with the invention may be of considerably smaller dimensions.

A second additional advantage of the resonator in accordance with the invention is the fact that the frequency of the combined vibration thus produced is only determined by one dimension of the body 1, namely the width of the body, i.e. the distance d between the side faces 6 and 7. This means that during manufacture only this dimension need be realized with the accuracy dictated by the resonant frequency.

The temperature dependence of the resonator shown obviously depends on the selected crystal, i.e. the angle $\theta$ through which the Y and Z axes have been rotated about the X-axis of the crystal, as is shown in the system of axes represented in FIG. 1. Computations have revealed that for quartz the first-order temperature coefficient is zero for $\theta = \pm 25°$. The frequency number for this cut, i.e. the product of the resonant frequency fo and the dimension d, is $fo.d = 2685$ kHz.m$^{-3}$.

FIG. 2 shows an embodiment which largely corresponds to that of FIG. 1. The only difference is that instead of using two electrodes 9, and 9' one electrode 9 is arranged on the major surface 3, which electrode extends over the full distance between the side faces 6 and 7 and is thus situated opposite both the electrode 8 and the electrode 8' on the major surface 2. This electrode is not connected to a signal terminal. The electrode automatically adopts a potential which is situated halfway between the levels of the two signals applied to the signal terminals 12 and 15 so that this electrode array also yields the desired oppositely directed fields in the Z' direction. An advantage of this embodiment is a less intricate design of the guide tracks by means of which the required connections to the signal terminals are established.

FIG. 4 shows an embodiment in which the body cut is selected so that the end faces 4 and 5 are perpendicular to the X-axis. The electrode array comprises three pairs of electrodes, namely 8 and 9; 8' and 9', and 16 and 16'. The electrodes 16 and 16' are connected to the signal terminal 15 and the other electrodes to the signal terminal 12. Thus two mutually opposed electric fields are produced parallel to the major surfaces and the end faces.

It is to be noted that the invention is by no means limited to the embodiments shown in the drawing. Within the scope of the present invention different electrode arrays and/or electrode shapes may be used, obviously depending on the selected crystal cut. For example, the electrodes on the major surfaces need not extend completely up to the edges of the major surface. It is for example also possible to arrange two electrodes, which are parallel to the edge between said end face and the major surface, on each major surface in the vicinity of the end face, which electrodes are spaced from each other and which are each connected to a separate signal terminal. Such an electrode array also generates a combination of electric fields which, depending on the selected crystal cut, can excite the desired resonant mode. It will also be evident that in respect of the shape and location of the guide tracks and the signal terminals, which also serve as supports, many variations are possible.

In respect of the shape of the body it is to be noted that, although this shape should be substantially rectangular, certain deviations from this rectangular shape are possible and sometimes desirable. For example, in general it is difficult to manufacture perpendicular surfaces without parts crumbling at the edge. As this may disturb the resonance pattern, the relevant edges, in particular the edges between the major surfaces 2 and 3 and the end face 4, are frequently rounded by a finishing operation. Furthermore, it is possible to provide faceting of the body in the vicinity of the end face 5 intended for supporting. Specifically, in the vicinity of this end face the distance between the side faces 6 and 7 may gradually be reduced. This additionally increases the asymmetry of the resonator, which is a requirement in order to obtain the desired resonant mode.

Furthermore, it will be evident that it is desired to mount the resonator in such a way that undesired resonant modes are damped at the location of said support near the end face 5. This ensures that all resonant modes which are symmetrical relative to the end faces are fully damped.

What is claimed is:

1. A piezoelectric resonator comprising a substantially rectangular body cut from a piezoelectric crystal to form first and second major surfaces parallel to each other and two opposed end faces bounding said major surfaces with the body exhibiting a crystal cut rotated about the X-axis, said major surfaces being perpendicular to the Z' axis and the end faces being perpendicular to the X or Y' axis, an electrode array provided on the first and second major surfaces in the direct vicinity of one of said two bounding end faces and arranged so that a combined resonant mode of vibration is produced in the body comprising an XY' thickness-shear vibration and a thickness vibration in the X or Y' direction, and wherein said body is adapted to be supported in the vicinity of the other one of said two end faces.

2. A piezoelectric resonator as claimed in claim 1, wherein said body includes two parallel side faces which extend transversely of the end faces and each of the major surfaces comprises two electrodes which are each individually situated in the direct vicinity of one of the side faces.

3. A piezoelectric resonator as claimed in claim 1, wherein the piezoelectric crystal comprises a quartz crystal and the thickness dimension of the body in the Z' direction is so small that undesired resonance vibrations in the Z' direction are prevented, and wherein the angle $\theta$ through which the Y and Z axes are rotated about the X-axis of the crystal is $\pm 25°$.

4. A piezoelectric resonator as claimed in claim 1, wherein said electrode array includes at least one pair of electrodes disposed opposite one another on said first and second major surfaces, respectively, and in the vicinity of said one bounding end face and close to one side face of said piezoelectric body, said electrodes being arranged so as to leave a substantial portion of the surface area of said major surfaces free of electrode material between the electrodes and the other one of said end faces.

5. A piezoelectric resonator as claimed in claim 1, wherein the body includes two side faces extending normal to the end faces and the electrode array includes two electrodes provided on one of the major surfaces and which are individually arranged in the direct vicinity of respective ones of the side faces, said two electrodes being individually connected to two electric signal terminals, and wherein the other major surface is provided with a common electrode which is arranged opposite said two electrodes.

6. A piezoelectric resonator as claimed in claim 1, wherein said electrode array includes a first and a second pair of electrodes with the electrodes of each pair arranged opposite each other and with one electrode of each pair disposed on the first major surface and the other electrode of each pair disposed on the second major surface, said first and second electrode pairs being situated respectively in the direct vicinity of first and second side faces of the body which extend transversely of the end faces, and a third pair of electrodes arranged opposite each other on said first and second major surfaces, respectively, and situated between the electrodes of the first and second pair, and means connecting the electrodes of the first and the second pair to a first signal terminal and the electrodes of the third pair to a second signal terminal, the body being cut so as to produce end faces that are perpendicular to the X-axis.

7. A piezoelectric resonator as claimed in claim 2, wherein the electrodes are connected to two electric signal terminals such that two mutually opposed electric fields are produced in the body which are perpendicular to the major surfaces.

8. A piezoelectric resonator as claimed in claim 2, wherein the electrodes are connected to two electric signal terminals such that an electric field is produced in the body which extends substantially parallel to the major surfaces and the end faces.

* * * * *

UNITED STATES PATENT AND TRADEMARK OFFICE
CERTIFICATE OF CORRECTION

PATENT NO. : 4,388,548

DATED : June 14, 1983

INVENTOR(S) : DANIEL C.L. VANGHELUWE

It is certified that error appears in the above-identified patent and that said Letters Patent is hereby corrected as shown below:

In the Abstract, line 8, after "generated" delete "," (comma)

In Column 1, line 23, change "4,017,797" to --4,071,797--

Signed and Sealed this

Second Day of October 1984

[SEAL]

Attest:

GERALD J. MOSSINGHOFF

Attesting Officer     Commissioner of Patents and Trademarks